United States Patent [19]

Kelly

[11] Patent Number: 4,710,625
[45] Date of Patent: Dec. 1, 1987

[54] CHARGED PARTICLE ENERGY ANALYZER BASED UPON ISENTROPIC CONTAINMENT

[75] Inventor: Michael A. Kelly, Portola Valley, Calif.

[73] Assignee: Kevex Corporation, Foster City, Calif.

[21] Appl. No.: 787,098

[22] Filed: Oct. 15, 1985

[51] Int. Cl.[4] .............................................. H01J 49/44
[52] U.S. Cl. .................................. 250/305; 250/306; 250/307; 250/290
[58] Field of Search ............... 250/305, 310, 306, 307, 250/290

[56] References Cited

U.S. PATENT DOCUMENTS 3,822,382  7/1974  Koike ................................. 250/305
4,081,677  3/1978  Dawson ............................. 250/290

Primary Examiner—Craig E. Church
Assistant Examiner—Jack I. Berman
Attorney, Agent, or Firm—Harry E. Aine

[57] ABSTRACT

Charged particles (ions or electrons) are directed into a drift tube closed off at the upstream and downstream ends by electrical grid members and having an axial magnetic field therein with a substantial radial component. The grids are pulsed to trap the charged particles in the drift tube where the radial magnetic field component mixes their axial and orbital momenta. The potential of the downstream grid is successively lowered for successively extracting particles having a successively lower energy. This analyzer is particularly useful for analyzing surface constitutents.

20 Claims, 3 Drawing Figures

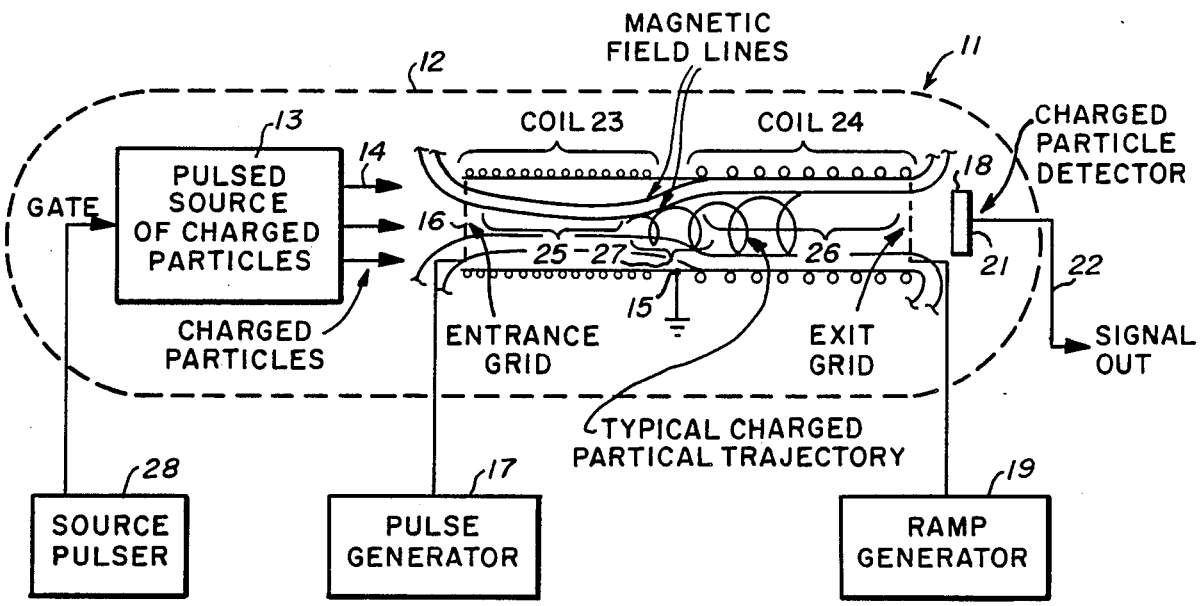
Fig_1
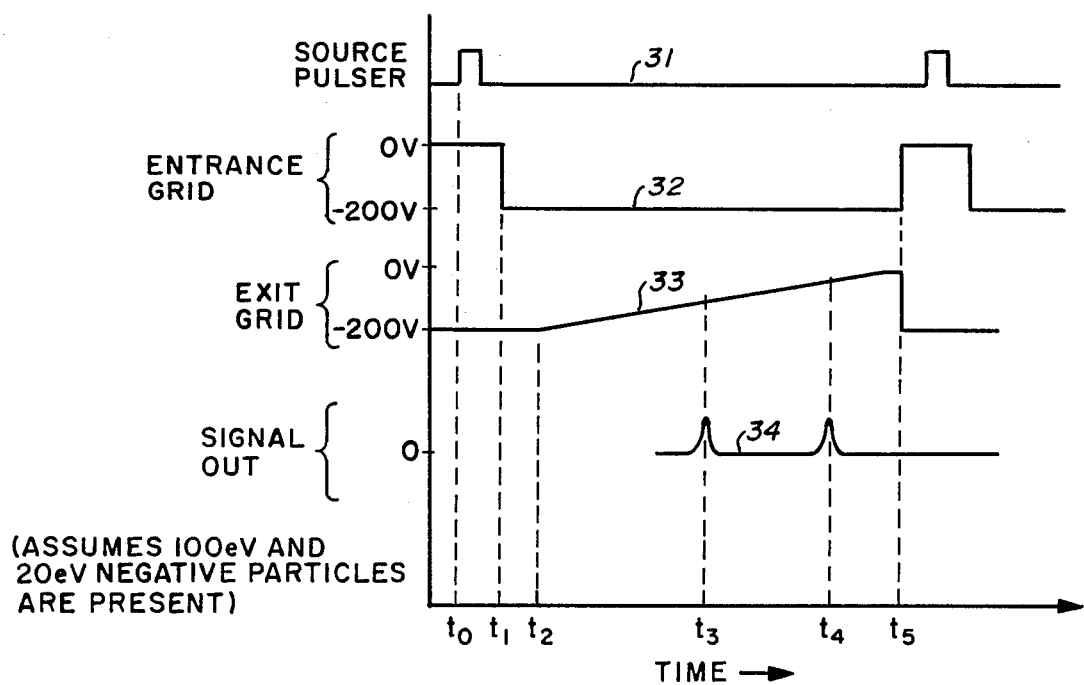
Fig_2

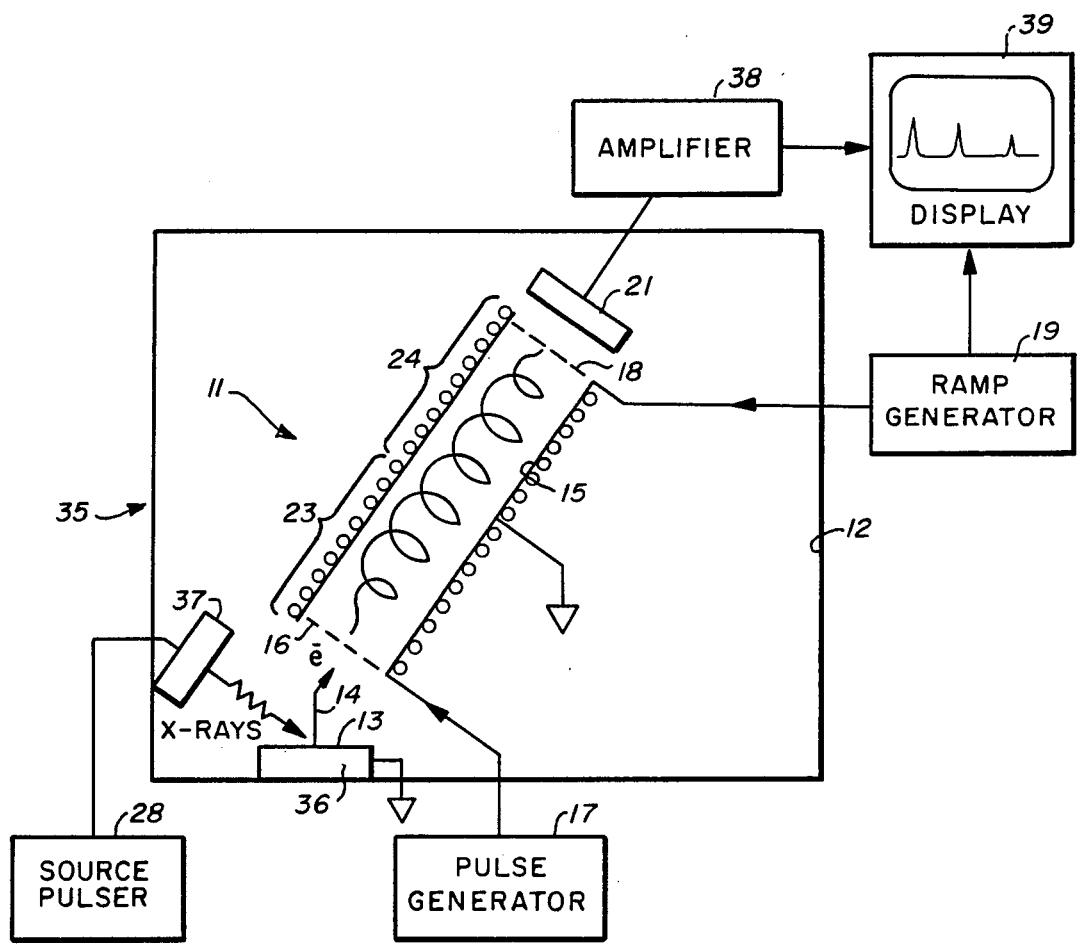
Fig_3

CHARGED PARTICLE ENERGY ANALYZER BASED UPON ISENTROPIC CONTAINMENT

BACKGROUND OF THE INVENTION

The present invention relates in general to charged particle energy analyzers and, more particularly, to such an analyzer employing isentropic (without degrading their energies) containment and to surface analyzers using same.

DESCRIPTION OF THE PRIOR ART

Heretofore, photoelectrons emitted from a surface under analysis in an evacuated chamber have been focused by means of an electrostatic lens into an electrostatic analyzer which spatially separates the electrons according to their different energies associated with different elements on the surface being analyzed. A positional detector in the analyzer detected the separated energy lines to give an analysis of the surface of the material under investigation. Such a surface analyzer is disclosed in U.S. Pat. No. 4,358,680 issued Nov. 9, 1982.

One of the problems associated with the charged particle energy analyzer of the spatial separation type is that the detected output energies are dependent upon the initial momentum or position of the charged particles entering the energy analyzer.

It would be desirable to provide a charge particle analyzer for use in such systems which would be much less dependent upon the initial momentum or position of the photoelectrons. In addition, it would be desirable if the sensitivity of the analyzer could be improved.

SUMMARY OF THE PRESENT INVENTION

The principal object of the present invention is the provision of an improved charged particle energy analyzer and surface analyzers using same.

In one feature of the present invention, the charged particles to be analyzed are trapped isentropically in an evacuated containment region in which the axial and orbital momenta of the trapped particles are mixed so that individual particles cyclically experience periodic maxima and minima axial momenta and selectively extracting from the containment region those particles having a maximum axial momenta exceeding a predetermined threshold energy level, thereby analyzing their energies.

In another feature of the present invention, the predetermined threshold energy level is successively lowered so as to obtain an energy spectrum of the trapped particles being analyzed.

In another feature of the present invention, the axial and orbital momenta of the charged particles are mixed by exposing the charged particles in the containment region to a radial component in an axial magnetic field.

In another feature of the present invention, the charged particles are isentropically trapped by trapping the charged particles within the containment region between an appropriate spatial distribution of electrical potential.

In another feature of the present invention, the charged particles are selectively extracted from the containment region by altering the spatial distribution of the electrical potential so as to extract the charged particles having a maximum axial momenta exceeding a predetermined threshold energy level.

Other features and advantages of the present invention will become apparent upon a perusal of the following specification taken in connection with the accompanying drawings wherein:

BRIEF DESCRIPTION OF THE DRAWINGS

FIG. 1 is a schematic line diagram, partly in block diagram form, of a charged particle energy analyzer incorporating features of the present invention, FIG. 2 is a timing diagram showing the various waveforms for functions obtained in the system of FIG. 1, and FIG. 3 is a schematic line diagram, partly in block diagram form, of a surface analyzer incorporating the charged particle analyzer of the present invention.

DESCRIPTION OF THE PREFERRED EMBODIMENTS

Referring now to FIG. 1, there is shown a charged particle energy analyzer 11 of the present invention. The analyzer 11 includes an evacuable envelope 12 containing a pulsed source of charged particles 13 for emitting the charged particles such as electrons or ions into a stream 14 emanating from the source 13.

An electrically conductive drift tube member 15 is disposed in generally axial alignment with the stream of charged particles 14 so as to receive the particles therein and to have the particles of the stream 14 move axially of the drift tube 15. A beam entrance grid 16 is disposed transversely across the entrance to the drift tube 15 and is supplied with a suitable operating potential from a pulse generator 17. Likewise, the exit end of the drift tube 15 is closed off by means of an exit grid 18 supplied with a suitable operating potential from a ramp generator 19. A charged particle detector 21 is disposed at the exit end of the drift tube 15 in axial alignment therewith for receiving the charged particle stream 14 incident thereon. The received charged particles cause a current to flow in a lead 22 coupled to the detector 21 to form an output signal.

Upstream and downstream electrical coils 23 and 24, respectively, are wound on the exterior of the drift tube 15 and are energized with suitable d.c. currents from d.c. current supplies, not shown, for producing an upstream axial magnetic field region 25 and a downstream axial magnetic field region 26 within the drift tube 15. Coils 23 and 24 are energized so as to produce axial magnetic field strengths within regions 25 and 26 which are of substantially different magnetic field intensities so that in a transition region between the upstream magnetic field region 25 and the downstream magnetic field 26 there is produced a substantial radial magnetic field component in the axial magnetic field within the drift tube 15 (the fringe field from a single coil will also produce the required radial component). The source 13 of charged particles is pulsed by means of a source pulser 28.

Referring now to FIGS. 1 and 2, the operation of the charged particle energy analyzer 11 will be described in greater detail. A short pulse of charged particles 14 to be analyzed, having an energy of 100 ev is produced by energizing the source pulser 28 to produce a source pulse waveform as shown at 31. The source pulse originates at $t_0$ and ends a short time thereafter. The stream of particles 14, emanating from the source 13, enters the drift tube 15 through the entrance grid 16 which is operating at zero potential as indicated by waveform 32. The magnetic field is generally axial within the drift tube 15 so that the particles which enter the drift tube 15 experience roughly helical motion as they traverse the length of the drift tube 15. The exit grid 18 is initially operated at a substantial negative potential so as to reflect the stream of particles, as of −200 volts, as indicated by waveform 33.

As the particles, travelling axially within the drift tube 15, approach the exit grid 18, they are repelled and, since the potential of this grid is greater than the kinetic energy of the particles to be analyzed, they are reflected before reaching the exit grid 18. While the charged particles to be analyzed are in the region of the drift tube 15 near the exit grid 18 and at a time $t_1$, the potential of the entrance grid 16 is changed or pulsed to −200 volts as indicated by waveform 32 so that the potential now of the entrance grid 16 and the exit grid 18 serves to produce a spatial potential distribution for relfecting the charged particles back and forth within the drift tube 15 at both ends thereof. Thus, the charged particles are now trapped within the drift tube 15 by means of the action of the axial magnetic field and the negative potential applied to the entrance grid 16 and the exit grid 18.

In the trapped condition, the charged particles will in general have both axial and orbital momenta, and, unless collisions occur, will have conserved energies. Those particles with the most axial momentum will approach the grids 16 and 18 more closely. The radial component of the axial magnetic field within the drift region 15 causes the orbital and axial momenta of the particles to be mixed so that the particle that has, for example, 50% of its total momentum in the orbital mode at one instant of time will, at a later instant of time, have 99% of its momentum in the axial mode. Still later, it may have returned to its original energy state. Thus, each and every particle trapped within the drift tube 15 experiences periodic maxima and minima axial momenta with corresponding minima and maxima orbital momenta.

With the particles trapped, the potential on the exit grid 18 is slowly lowered toward zero potential. As the potential is lowered, it will become energetically possible for some of the particles to escape through the exit grid 18 of the detector 21. The first ones to do so will be those having the largest axial momentum. Suppose, for example, at some time $(t_2+\Delta_t)$ the exit grid 18 has a potential of −101 volts. If it retains this potential long enough, each particle with an energy greater than or equal to 101 volts will have passed through a condition in which all of its momenta is in the axial mode, and would have escaped through the exit grid 18 to the detector 21. Hence, the particles left in the containment region between the beam entrance grid 16 and the exit grid 18 would have energies less than 101 electron volts.

Now, if at time $t_3$ the exit grid potential is lowered to 100 volts, those particles with energies between 100 and 101 electron volts can escape, and will do so provided the exit grid potential remains at 100 volts long enough for each particle to pass through the condition in which all of its momentum is in the axial mode. Thus, the resolution of the analyzer is dependent upon dv/dt of the exit grid 18. The exit grid voltage is successively lowered to allow particles of successively lower energies to escape and be detected by the detector 21.

A typical output signal, when there are two groups of electrons present, one group having an energy of about 100 electron volts and the other group about 20 electron volts, is shown as waveform 34. More particularly, the output signal will have a peak $t_3$ when the beam exit potential is −100 volts and a second peak at $t_4$ when the beam exit potential is −20 volts. As an illustration of the time scale involved, if $t_0$ equals 0, and $t_1$ is approximately 30 nanoseconds, $t_2$ is approximately one microsecond, $t_3$ is approximately 1 millisecond and $t_4$ is approximately two milliseconds. Once all the particles trapped within the drift tube have been analyzed, the cycle is repeated. Thus, the analyzer 11 takes a pulse of charged particles having arbitrary initial momenta and sorts them according to energy.

Referring now to FIG. 3, there is shown a surface analyzer 35 incorporating features of the present invention. Surface analyzer 35 includes the evacuated chamber 12 evacuated to a very low pressure so gas atoms do not interfere with electron trajectories within the chamber 12. A sample of material 36, the surface 13 of which is to be analyzed, is disposed within the chamber 12. X-rays derived from an X-ray source 37 within the chamber 12 are directed onto the surface 13 of the sample to be analyzed. In a typical example, the X-rays have an energy of 1486 electron volts.

The impinging X-rays produce photoelectrons 14 emitted from the surface 13. The photoelectrons 14 have various energies depending upon the element which is bombarded by the X-rays and which produces the photoelectron. In a typical example, oxygen on the surface bombarded by the X-rays of the aforecited energy emits photoelectrons of 1,000 electron volts. Similarly, carbon emits at 1200 electron volts, fluorine emits at 800 volts and sodium emits at 400 electron volts.

The surface which is bombarded serves as the source 13 for the energy analyzer 11, previously described with regard to FIGS. 1 and 2. The energy analyzer 11 analyzes the energy of the emitted photoelectrons 14 as a function of time or of the ramp generator signal derived from the ramp generator 19 to produce an output signal which is detected by detector 21 and amplified by amplifier 38. The amplified output signal from amplifier 38 is fed to one input of a display 39, such as an oscilliscope or chart recorder, for display as a function of time or of the ramp generator signal 19 to derive an energy spectrum of the sample under analysis.

Thus, there is a spectral output display 39 displaying the output energies of the photoelectrons 14 emitted from the surface 13. Each of the peaks (lines) of the display corresponds to a different element found on the surface 13. In this manner, the surface 13 of the sample 36 is analyzed for its constituents.

The advantage of the energy analyzer 11 of the present invention is that its output is less dependent upon the initial momentum or position of the particles 14 being analyzed. Moreover, it stores and analyzes all the trapped particles so that it can have higher sensitivity.

What is claimed is:
1. In a method for analyzing the energies of charged particles, the steps of:
  generally isentropically trapping the charged particles to be analyzed in an evacuated containment region;
  mixing the axial and orbital momenta of the trapped charged particles so that an individual particle cyclically experiences periodic maximum and minimum axial momenta with corresponding minimum and maximum orbital momenta; and
  analyzing the energy of the particles by selectively extracting from the containment region those parti- cles having a maximum axial momenta exceeding a predetermined threshold energy level.

2. The method of claim 1 including the step of: successively lowering the threshold energy level while selectively extracting so as to obtain an energy spectrum of the trapped particles being analyzed.

3. The method of claim 1 wherein the charged particles being analyzed are photoelectrons.

4. The method of claim 3 wherein the photoelectrons emanate from a surface due to exposure to X-ray radiation.

5. The method of claim 1 including the step of: detecting the quantity of charged particles selectively extracted from the containment region as a function of time.

6. The method of claim 1 wherein the step of mixing the axial and orbital momenta of the charged particles includes exposing the charged particles in the containment region to a radial component in an axial magnetic field.

7. The method of claim 1 wherein the step of trapping the charged particles in the containment region includes the step of:
trapping the charged particles within an appropriate spatial distribution of electrical potential.

8. The method of claim 7 wherein the step of selectively extracting the charged particles from the containment region includes the step of:
altering the spatial distribution of electrical potential so as to extract the charged particles having a maxima axial momenta exceeding a predetermined threshold energy level.

9. In a charged particle energy apparatus:
means for generally isentropically trapping the charged particles to be analyzed in an evacuated containment region;
means for mixing the axial and orbital momenta of the trapped charged particles so that the individual particles cyclically experience periodic maximum and minimum axial momenta with corresponding minimum and maximum orbital momenta; and
analyzing means for selectively extracting from the containment region those particles having a maxima axial momenta exceeding a predetermined threshold energy level.

10. The apparatus of claim 9 wherein said analyzing means includes means for selectively lowering the threshold energy level of said analyzing means so as to obtain an energy spectrum of the trapped particles being analyzed.

11. The apparatus of claim 9 including source means serving as a source of charged particles being analyzed, said source means comprising a photoelectron emitter for emitting the electrons in response to radiation incident thereon.

12. The apparatus of claim 11 wherein the radiation incident on the photoemitter is X-ray radiation.

13. The apparatus of claim 9 including:
detector means for detecting the quantity of charged particles selectively extracted from the containment region as a function of time.

14. The apparatus of claim 9 wherein said mixing means for mixing the axial and orbital momenta of the charged particles includes magnetic field generating means for generating an axial magnetic field in the containment region said axial magnetic field having a radial component for mixing the axial and orbital momenta of the charged particles within the containment region.

15. The apparatus of claim 9 wherein said trapping means includes electrical means for producing a spatial distribution of electrical potential within the containment region for trapping of the charged particles in the containment region.

16. The apparatus of claim 15 wherein said analyzing means includes means for altering the spatial distribution of electrical potential so as to extract the charged particles having a maximum axial momenta exceeding a predetermined threshold energy level.

17. In a method for analyzing the surface of a material for its elemental constituents comprising, the steps of:
radiating the surface to be analyzed with X-rays to produce photoelectron emission from the surface being analyzed;
generally isentropically trapping the photoelectrons emitted from the surface under analysis in an evacuated containment region;
mixing the axial and orbital momenta of the trapped photoelectrons so that the individual electrons cyclically experience periodic maximum and minimum axial momenta with corresponding minimum and maximum orbital momenta; and
analyzing the energy of the photoelectrons by selectively extracting from the containment region those photoelectrons having a maxima axial momenta exceeding a predetermined threshold energy level.

18. The method of claim 17 including the step of: successively lowering the threshold energy level so as to obtain an energy spectrum of the trapped photoelectrons being analyzed.

19. In a surface analyzer apparatus:
means for irradiating the surface to be analyzed with radiation to produce photoelectron emission therefrom;
generally isentropically trapping means for trapping the photoelectrons emitted from a surface in an evacuated containment region;
means for mixing the axial and orbital momenta of the trapped photoelectrons so that the individual photoelectrons cyclically experience periodic maxima and minima axial momenta with corresponding minima and maxima orbital momenta; and
analyzing means for selectively extracting from the containment region those particles having a maxima axial momenta exceeding a predetermined threshold energy level.

20. The apparatus of claim 19 including means for successively lowering the threshold energy level so as to obtain an energy spectrum of the trapped photoelectrons being analyzed.

* * * * *